United States Patent
Erickson (10) Patent No.: US 9,208,278 B2
(45) Date of Patent: Dec. 8, 2015

(54) CLUSTERING USING N-DIMENSIONAL PLACEMENT

(71) Applicant: Synopsys, Inc., Mountain View, CA (US)

(72) Inventor: Robert J. Erickson, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/928,293

(22) Filed: Jun. 26, 2013

(65) Prior Publication Data

US 2015/0007120 A1    Jan. 1, 2015

(51) Int. Cl.
*G06F 17/50* (2006.01)

(52) U.S. Cl.
CPC ........ *G06F 17/5072* (2013.01); *G06F 17/5054* (2013.01)

(58) Field of Classification Search
CPC .......... G06F 17/5072; G06F 15/17387; G06F 17/5054; G06F 17/5077
See application file for complete search history.

(56) References Cited

U.S. PATENT DOCUMENTS

| | | | |
|---|---|---|---|
| 6,088,519 A * | 7/2000 | Koford | 716/123 |
| 6,665,850 B1 | 12/2003 | Andreev et al. | |
| 7,137,097 B1 * | 11/2006 | Aji et al. | 716/129 |
| 7,237,214 B1 * | 6/2007 | Pandey et al. | 716/131 |
| 8,327,304 B2 | 12/2012 | Moffitt et al. | |
| 8,689,164 B2 * | 4/2014 | Balabanov et al. | 716/119 |
| 2004/0006750 A1 * | 1/2004 | Cheng et al. | 716/3 |
| 2005/0207491 A1 * | 9/2005 | Zhang et al. | 375/240.16 |
| 2007/0245281 A1 * | 10/2007 | Riepe et al. | 716/9 |
| 2009/0066366 A1 * | 3/2009 | Solomon | 326/41 |
| 2013/0097574 A1 * | 4/2013 | Balabanov et al. | 716/123 |

OTHER PUBLICATIONS

"Gravity: Fast Placement for 3-D VLSI", by Stefan Thomas Obenaus, ACM @2003.*
"Force-directed Partitioning Technique for 3D IC", by Alysa Fakheri Tabrizi, Jan. 2013.*
Han, Eui-Hong (Sam, et al, "Hypergraph Based Clustering in High-Dimensional Data Sets: A Summary of Results," IEEE Computer Society Technical Committee on Data Engineering, 1997, 8 pages.

* cited by examiner

*Primary Examiner* — Nha Nguyen
(74) *Attorney, Agent, or Firm* — HIPLegal LLP; Judith A. Szepesi (57) ABSTRACT

A method and apparatus to cluster nodes of a hypergraph is described. The method improves the clustering by placing the hypergraph into an N-dimensional space. The method receives a design represented by a hypergraph with a plurality of nodes. The method places the plurality of nodes of the hypergraph into the N-dimensional space, where N is greater than or equal to 2. The method clusters nodes of the hypergraph based on locations of the plurality of nodes in the N-dimensional space.

20 Claims, 8 Drawing Sheets

CLUSTERING USING N-DIMENSIONAL PLACEMENT

FIELD

The present invention relates to allocation of computational resources, and in particular to a method of partitioning an integrated circuit design.

BACKGROUND

A hypergraph is a generalization of a graph in which an edge can connect any number of vertices. Formally, a hypergraph G=(V, E) is defined as a set of vertices (or nodes) V and a set of hyperedges (or edges) E, where each hyperedge is a subset of the vertex set V, and the size (or order) of a hyperedge is the cardinality of this subset.

Hypergraph partitioning is an important problem with extensive application to many areas, including VLSI design, efficient storage of large databases on disks, and data mining. The k-way partitioning problem assigns each node of a hypergraph into one of k bins while attempting to minimize the "cut metric", i.e., the number of hyperedges that connect nodes assigned to multiple bins. Real world partitioning problems often have multi-valued cost functions in addition to the edge-cost and obey various constraints. For an application that partitions integrated circuit designs, the hypergraph is a netlist that represents a design that needs to be partitioned into k field-programmable gate array (FPGA) units of a system for FPGA-based prototyping. In addition to the cut metric, the application requires attention to the timing of the system and to the number and configuration of the wires available to interconnect the FPGA units.

The most common method used for partitioning is the multi-level partitioning approach developed by Karypis and Kumar for the hMETIS system. This approach begins by coarsening the hypergraph using connectivity-based clustering and then repeatedly applying the Fiduccia-Mattheyses (FM) algorithm to partition the hypergraph followed by "uncoarsening" the graph.

The quality of results (QoR) of hMETIS approach is sensitive to the quality of the clustering and to the quality of the initial solution at the coarsest level of the hypergraph. The FM algorithm can get stuck at local minima set up in the first partitioning step. Also, k-way FM algorithm's runtime complexity is linear in k. The common use of recursive bi-partitioning to reduce the complexity to log(k) is impractical given the global nature of the non-cut metrics in this problem.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

A method and apparatus to cluster nodes of a hypergraph is described. The method improves the clustering by placing the hypergraph into an N-dimensional space. In one embodiment, the hypergraph is a netlist that represents an integrated circuit design that needs to be partitioned into k units of a system. In one embodiment, each unit of the system is a field programmable gate array (FPGA) and the integrated circuit design is partitioned for FPGA-based prototyping. In an exemplary embodiment, the method receives a design represented by a hypergraph with a plurality of nodes. The method places the plurality of nodes of the hypergraph into an N-dimensional space, where N is greater than or equal to 2. In one embodiment, the greater the number of dimensions used in the placement a hypergraph, the better the result of the clustering of the hypergraph is likely to be. The method clusters nodes of the hypergraph based on locations of the plurality of nodes in the N-dimensional space.

In one embodiment, the hypergraph is a hierarchical hypergraph. The method partially clusters nodes of the hierarchical hypergraph using a hierarchy and/or connectivity-based clustering before placing the plurality of nodes into the N-dimensional space. In order to cluster nodes of the hypergraph based on locations of the plurality of nodes in the N-dimensional space, the method identifies a set of hyperedges based on a first set of criteria. In one embodiment, the first set of criteria includes a requirement that each identified hyperedge has an order less than an order threshold. For each identified hyperedge, the method identifies pairs of nodes connected by the hyperedge based on a second set of criteria. In one embodiment, the second set of criteria includes a requirement that the distance between each identified pair of nodes in the N-dimensional space is less than a distance threshold. The method adds the identified pairs of nodes into a sorted list that is sorted based on a function of locations for each identified pair of nodes. For each pair of nodes in the sorted list, in the sorted sequence from the closest pairs to the farthest pairs, the method forms a new cluster from the clusters containing the two nodes of the pair. The method additionally clusters nodes of the hypergraph using connectivity-based clustering after nodes of the hypergraph are clustered based on locations of the plurality of nodes in the N-dimensional space.

In another embodiment, the method clusters nodes of the hypergraph before placing the plurality of nodes into the N-dimensional space. In one embodiment, in order to cluster nodes of the hypergraph based on locations of the plurality of nodes in the N-dimensional space, the method uses the k-harmonic-means algorithm with weighting to generate 2k clusters according to the N-dimensional placement of the hypergraph. The method greedily pairs the most highly connected clusters among the 2k clusters to generate a k-partition initial solution. The method performs a single pass of Fiduccia-Mattheyses (FM) partitioning to improve and legalize the initial solution.

In one embodiment, in order to place the plurality of nodes into the N-dimensional space, the method generates an initial random placement of the plurality of nodes in the N-dimensional space. The method iteratively solves to minimize a convex wire-length function of the N-dimensional locations and generates a density-legal placement using an N-dimensional grid-warping until the placement of the plurality of nodes in the N-dimensional space converges.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

DEFINITIONS

Several definitions that apply throughout this document will now be presented.

A "Fiduccia-Mattheyses algorithm" is a classical approach to solve the hypergraph bipartitioning problem using an iterative heuristic, as defined by Fiduccia and Mattheyses.

"K-means algorithm" is a method of cluster analysis that aims to partition n observations into k clusters, in which each observation belongs to the cluster with the nearest mean. A mean is a central value of a discrete set of numbers. Specifically, the sum of the values divided by the number of values.

"K-harmonic-means algorithm" is a method similar to k-means algorithm but arises from a different objective function. The objective function of k-harmonic-means algorithm uses the harmonic mean of the distance from each data point to all centers.

"Greedy pairing" means pairing nodes by following the problem solving heuristic of making the locally optimal choice at each stage with the hope of finding a global optimum.

"Grid warping" means a placement algorithm that elastically deforms a model of the N-dimensional space in which the nodes have been roughly placed, locally "stretching" the space until the nodes arrange themselves to positions that satisfy a set of criteria. Put simply, grid warping moves the grid, and the locations of the nodes follow the locations of the grid.

"Connectivity-based clustering" means a clustering algorithm that uses a metric based on the connectivity of the hypergraph to decide whether two nodes should be clustered. For example, one such heuristic may compare nodes based on the number of edges that they share.

"Hierarchical Hypergraph" means a hypergraph that has been defined as a recursive set of connected sub-hypergraphs, where each sub-hypergraph is a collection of sub-hypergraphs, nodes, edges, and an additional set of "ports" that define which edges are visible to the containing hypergraph and how they are connected within the containing hypergraph.

"Hierarchy Clustering" of a hierarchical hypergraph means to combine all nodes of a sub-hypergraph into a single cluster.

Figure 1:
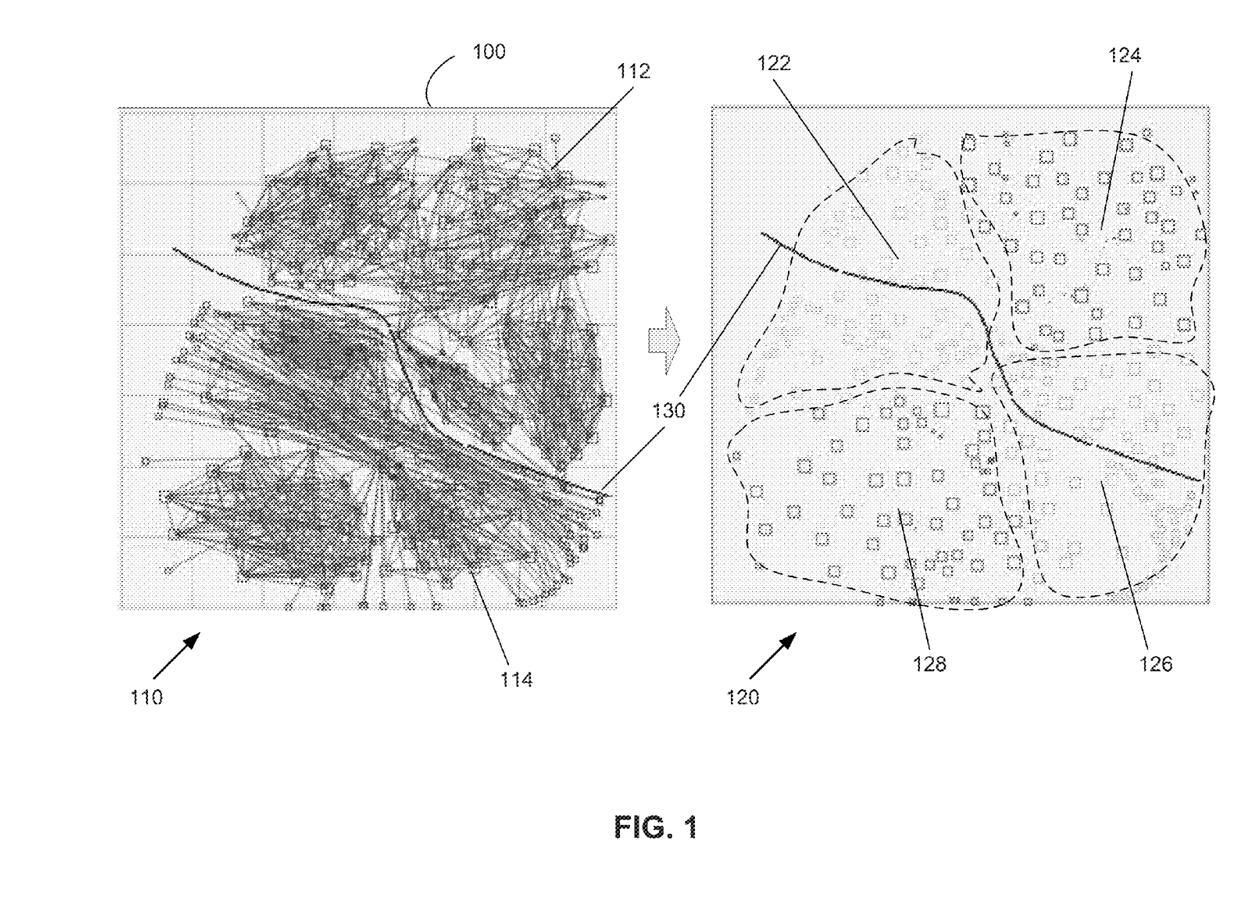
FIG. 1 illustrates an example of using two-dimensional placement to cluster a set of nodes.

FIG. 1 illustrates an example of using two-dimensional placement to cluster a set of nodes. Specifically, this figure illustrates clustering a design 100 based on its placement in the two-dimensional space in two stages 110 and 120. As illustrated in the figure, the design 100 includes many nodes that are represented as squares. The nodes of design 100 are connected through edges, which are represented as lines in FIG. 1.

The first stage 110 illustrates the design 100 placed in the two-dimensional space before it is clustered. The natural clusters of the design 100 in the two-dimensional space are quite obvious to the human eye. Especially, the human eye can easily see that the design 100 can be divided into two sections 112 and 114, which are separated by a gap 130 in the two-dimensional space.

In the second stage 120, the design that has been partitioned into four clusters 122, 124, 126, and 128 in the two-dimensional space by using a variation of the k-means algorithm, which looks only at the locations of the nodes. The partition found some of the obvious clusters, such as clusters 124 and 128. However, clusters 122 and 126 cross the gap 130 between the two sections 112 and 114 of the two-dimensional placement. Therefore, the k-means algorithm used to partition a design placed in a two-dimensional space cannot clearly separate the natural clusters from each other.

Figure 2:
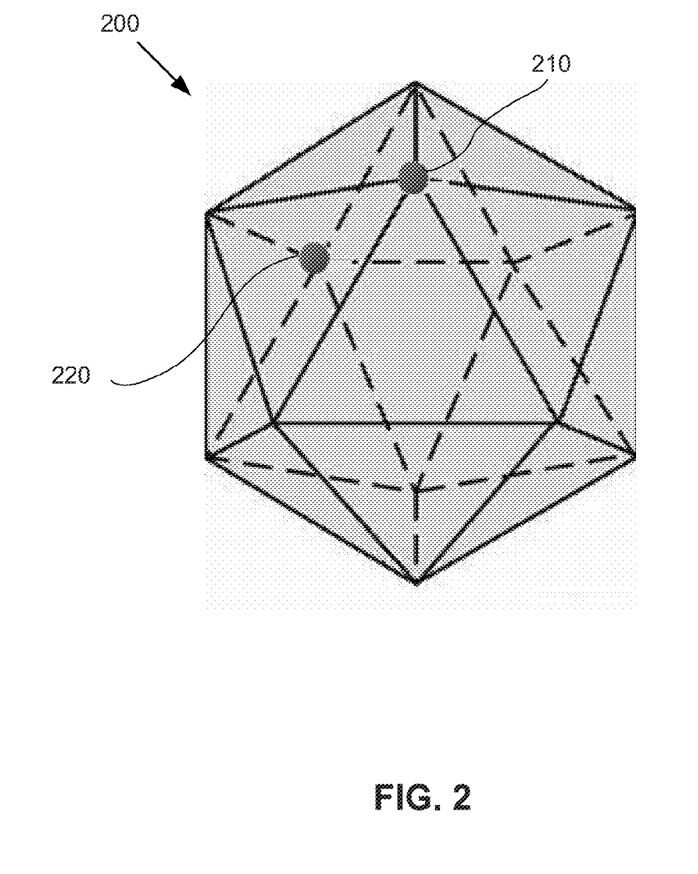
FIG. 2 illustrates a three-dimensional space of an icosahedron projected on a two-dimensional space.

FIG. 2 illustrates a mapping of a three-dimensional icosahedral graph 200 onto a two-dimensional space. Specifically, this figure illustrates the benefit of placing a design into the three-dimensional space in comparison to a placement in the two dimensional space.

As illustrated, two nodes 210 and 220 are placed on two vertices of the icosahedron 200. Since the two nodes 210 and 220 are placed near each other in the two-dimensional space, they are likely to be clustered together using only their locations as criteria. However, the two nodes 210 and 220 are not closely related in the graph, as they don't connect to each other directly through an edge of the icosahedron 200. If, however, the nodes of the icosahedral graph are placed in three dimensions as an icosahedron, the two nodes 210 and 220 will be farther apart and will be less likely to be placed in the same cluster. Therefore, placing a hypergraph in three or more dimensions makes unrelated nodes less likely to be evaluated as near each other. In addition, the gaps between the natural clusters will be more pronounced in the three-dimensional placement.

By using the three-dimensional placement, the resulting clustering of a hypergraph is often much better than using a two-dimensional placement. Similarly, the resulting clustering of a hypergraph using a four-dimensional placement is often better than using a three-dimensional placement.

Figure 3:
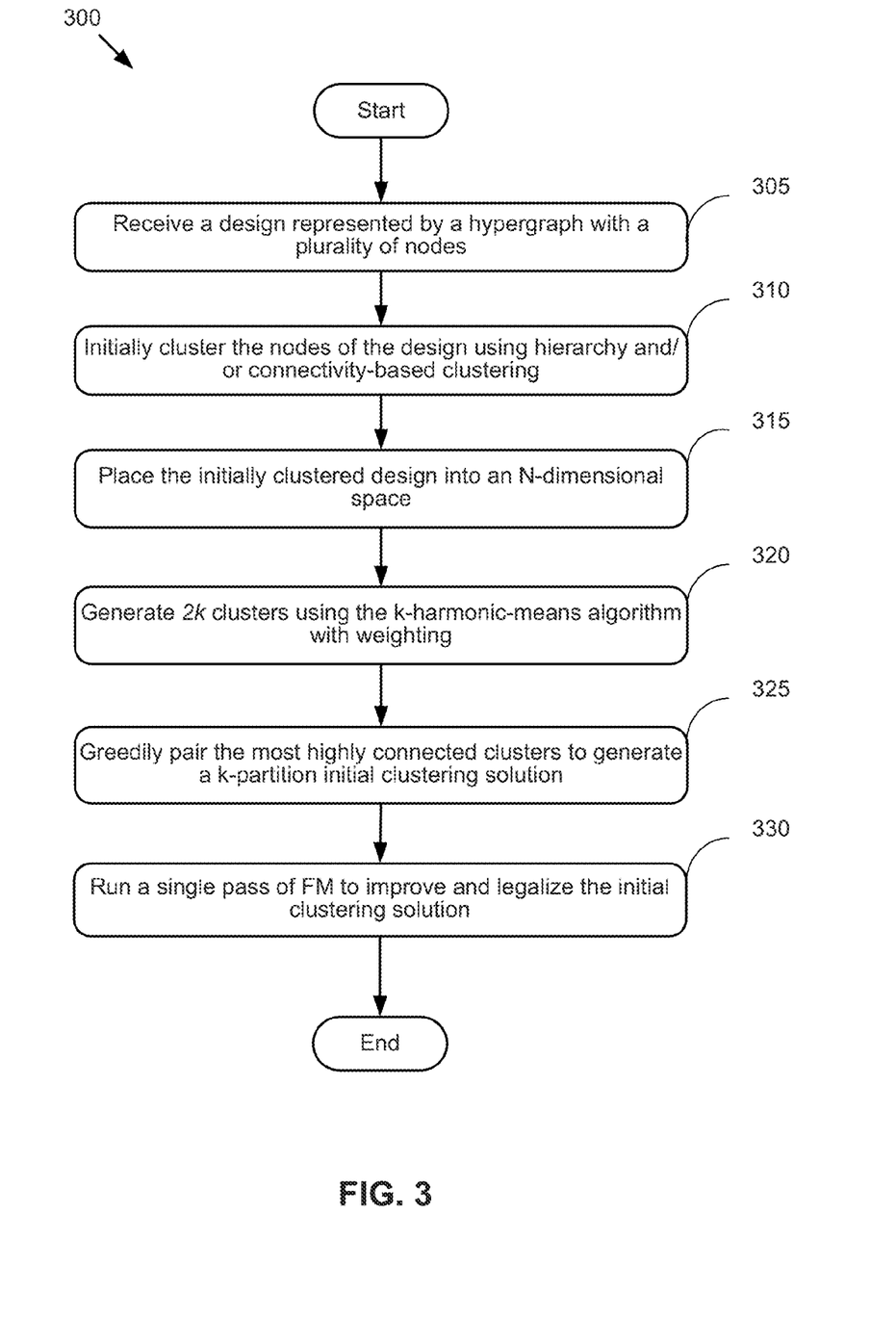
FIG. 3 is a flowchart of one embodiment of clustering a hypergraph into k clusters by using the locations of the nodes placed in an N-dimensional space.

FIG. 3 is a flowchart of one embodiment of clustering a hypergraph into k clusters by using the locations of the nodes placed in an N-dimensional space. Specifically, this figure describes a process 300 that uses k-harmonic-means algorithm to identify clusters of a hypergraph placed in the N-dimensional space. In one embodiment, the process 300 starts when a design needs to be partitioned into smaller components. As shown in the figure, the process 300 begins by receiving, at block 305, a design represented by a hypergraph with a plurality of nodes. In one embodiment, the hypergraph is a hierarchical hypergraph. In one embodiment, the hypergraph is a netlist that represents an integrated circuit design that needs to be partitioned into k units of a system. In one embodiment, each unit of the system is a field programmable gate array (FPGA) and the integrated circuit design is partitioned for FPGA-based prototyping. Each logic circuit of the integrated circuit design is represented as a node in the hypergraph.

At block 310, the process 300 initially clusters the nodes of the design using hierarchy and/or connectivity-based clustering in order to reduce the complexity of the placement problem. As a result, nodes in the originally received hypergraph are partitioned into several clusters. Each cluster contains one or more nodes of the original hypergraph. Each cluster is a single node in an updated hypergraph. Therefore, the updated hypergraph has fewer nodes than the original hypergraph. Some hyperedges in the original hypergraph may be fully contained in the clusters and are therefore not part of the updated hypergraph. Large hyperedges in the original hypergraph are also contracted to smaller hyperedges in the updated hypergraph.

The process 300 at block 315 places the initially clustered design, i.e., the updated hypergraph, into an N-dimensional space. In one embodiment, each node is represented as a unit hypercube in the N-dimensional space and the N-dimensional placement space can be represented as a hypercube with volume much greater than the total volume of the node hypercubes, and each node has no constraints except that it must be contained within the placement space. One embodiment of the method used for placing a hypergraph into an N-dimensional space is further described in FIG. 5 below.

At block 320, the process 300 generates 2k clusters using the k-harmonic-means algorithm with weighting to encourage balanced sizes of clusters in one embodiment. In another embodiment, the process 300 uses another center-based clustering algorithm, such as k-means algorithm, fuzzy k-means algorithm, and Gaussian expectation-maximization, to generate the 2k clusters. In one embodiment, the number of clusters generated by block 320 of the process 300 can be any number that is larger than k, e.g., one and a half times of k and 3k.

At block 325, the process 300 greedily pairs the most highly connected clusters to generate a k-partition initial clustering solution. The process selects groups of clusters to merge together to form single clusters in the next level of merging. The clusters are represented as vertices of a hypergraph. In one embodiment, block 325 of the process 300 selects the groups of highly connected clusters by finding a maximal set of pairs of vertices that belong in multiple hyperedges. In one embodiment, each group consists of at most two vertices (some vertices are not combined at all), and each vertex belongs to exactly one group.

In another embodiment, block 325 of the process 300 selects the groups of highly connected clusters by finding a maximal independent set of hyperedges, where the vertices that belong to each hyperedge become a group of vertices to be merged together. In this embodiment, each group can have an arbitrary number of vertices (even though in one embodiment preference is given to smaller groups), and each vertex belongs to exactly one group.

In one embodiment, block 325 of the process 300 selects the groups of highly connected clusters by visiting the vertices in a random order. For each vertex v, all unmatched vertices that belong to hyperedges incident to v are considered, and the one that is connected via the edge with the largest weight is matched with v. The weight of an edge connecting two vertices v and u is computed as the sum of the edge-weights of all the hyperedges that contain v and u. Each hyperedge e of size |e| is assigned an edge-weight of $1/(|e|-1)$.

Next, the process 300 in one embodiment runs, at block 330, a single pass of FM algorithm to improve and legalize the initial clustering solution. The process 300 then ends.

One of ordinary skill in the art will recognize that the process 300 is a conceptual representation of the operations used to perform k-way clustering. The specific operations of the process 300 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 300 is performed by one or more software applications that execute on one or more computers.

Figure 4:
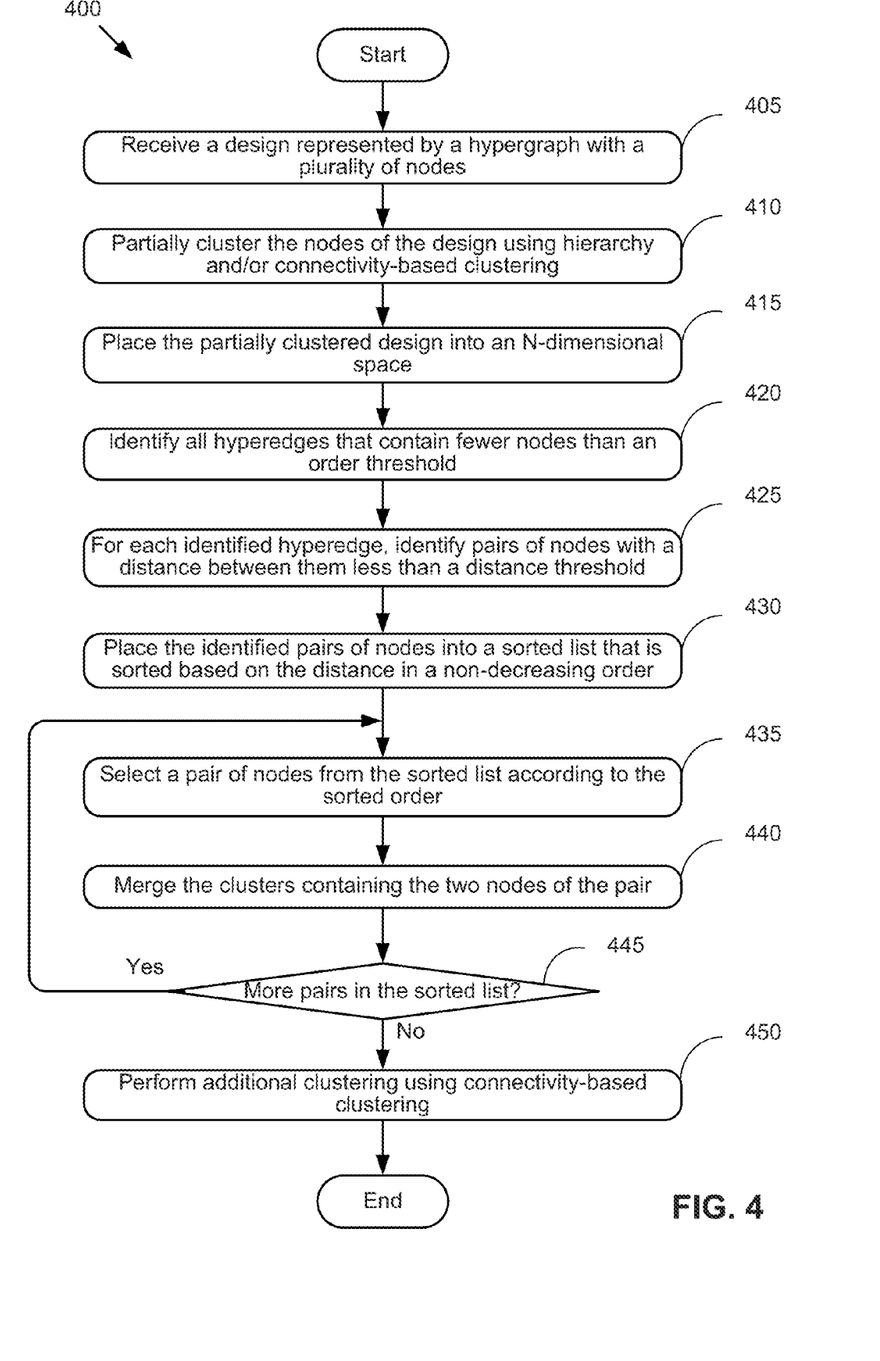
FIG. 4 is a flowchart of one embodiment of the present invention that uses the wires and the locations to create good clusters without specifying the desired number of clusters.

The k-means algorithm generally needs the number of partitions k to be specified and it is seldom clear how to select the appropriate value of k. FIG. 4 is a flowchart of one embodiment of using the wires and the locations to create good clusters without specifying the desired number of clusters. Specifically, this figure describes a process 400 that identifies clusters of a hypergraph placed in the N-dimensional space without specifying the desired number of clusters. In one embodiment, the process 400 starts when a design needs to be partitioned into smaller components.

As shown in FIG. 4, the process 400 begins by receiving, at block 405, a design represented by a hypergraph with a plurality of nodes. In one embodiment, the hypergraph is a hierarchical hypergraph. In one embodiment, the hypergraph is a netlist that represents an integrated circuit design that needs to be partitioned into k units of a system. In one embodiment, each unit of the system is a field programmable gate array (FPGA) and the integrated circuit design is partitioned for FPGA-based prototyping. Each logic circuit of the integrated circuit design is represented as a node in the hypergraph.

At block 410, the process 400 partially clusters the nodes of the design using hierarchy and/or connectivity-based clustering in order to reduce the complexity of the placement problem. As a result, nodes in the originally received hypergraph are partitioned into several clusters. Each cluster contains one or more nodes of the original hypergraph. Each cluster is a single node in the updated hypergraph. Therefore, the updated hypergraph has fewer nodes than the original hypergraph. Some hyperedges in the original hypergraph may be fully contained in the clusters and are therefore not part of the updated hypergraph. Large hyperedges in the original hypergraph are also contracted to smaller hyperedges in the updated hypergraph.

In one embodiment, block 410 of the process 400 performs the partial clustering by stopping the clustering when any new clustering will create a cluster whose resource usage is greater than a specified limit. In one embodiment, the limit is set so that the number of clusters created by the partial clustering is about 1000-5000. In doing full clustering, in one embodiment a higher limit is set, for example, to create less than 100 clusters.

The process 400 at block 415 places the partially clustered design, i.e., the updated hypergraph, into an N-dimensional space. One embodiment of placing a hypergraph into an N-dimensional space is further described in FIG. 5 below.

At block 420, the process 400 identifies all hyperedges that contain fewer nodes than an order threshold, i.e. having an order less than the order threshold. In one embodiment, the order threshold is set to be eight. That means all hyperedges that contain fewer than eight nodes will be identified.

For each identified hyperedge, the process 400 evaluates all pairs of nodes connected to the hyperedge and identifies, at block 425, pairs of nodes with a distance between them less than a distance threshold. In one embodiment, the distance threshold is set to be 5 cell-widths. One of ordinary skill in the art will recognize that there are multiple ways to measure distance in an N-dimensional space, which is a function of the locations in the N-dimensional space. For example and in one embodiment, the distance between a pair of nodes is the Euclidean distance between the nodes in the N-dimensional space. In another embodiment, the distance between a pair of node is the Manhattan distance between the two nodes, which is the sum of the absolute differences of their coordinates.

At block 430, the identified pairs of nodes are placed into a sorted list that is sorted based on the distance between the two members of each pair. In one embodiment, the sorting is in a non-decreasing order, i.e., from closest pairs to farthest pairs.

At block 435, the process 400 selects a pair of nodes from the sorted list according to the sorted order; in one embodiment the closest pairs first. At block 440, the process merges the clusters containing the two nodes of the selected pair to form a new cluster.

At block 445, the process determines whether there are more pairs of nodes in the sorted list that have not yet been processed. If there are more pairs of nodes in the sorted list, the process 400 returns to block 435 to select a new pair of nodes to merge, according to the sorted order.

If all pairs of nodes in the sorted list have been processed, the process 400 performs additional clustering, at block 450, using connectivity-based clustering on the merged clusters. In one embodiment, it means performing full clustering using connectivity-based clustering. In one embodiment, block 450 of the process 400 handles high-fanout nets and nodes that are not close to any neighbor. The process 400 then ends.

One of ordinary skill in the art will recognize that the process 400 is a conceptual representation of the operations used to perform clustering on a hypergraph. The specific operations of the process 400 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 400 is performed by one or more software applications that execute on one or more computers.

Figure 5:
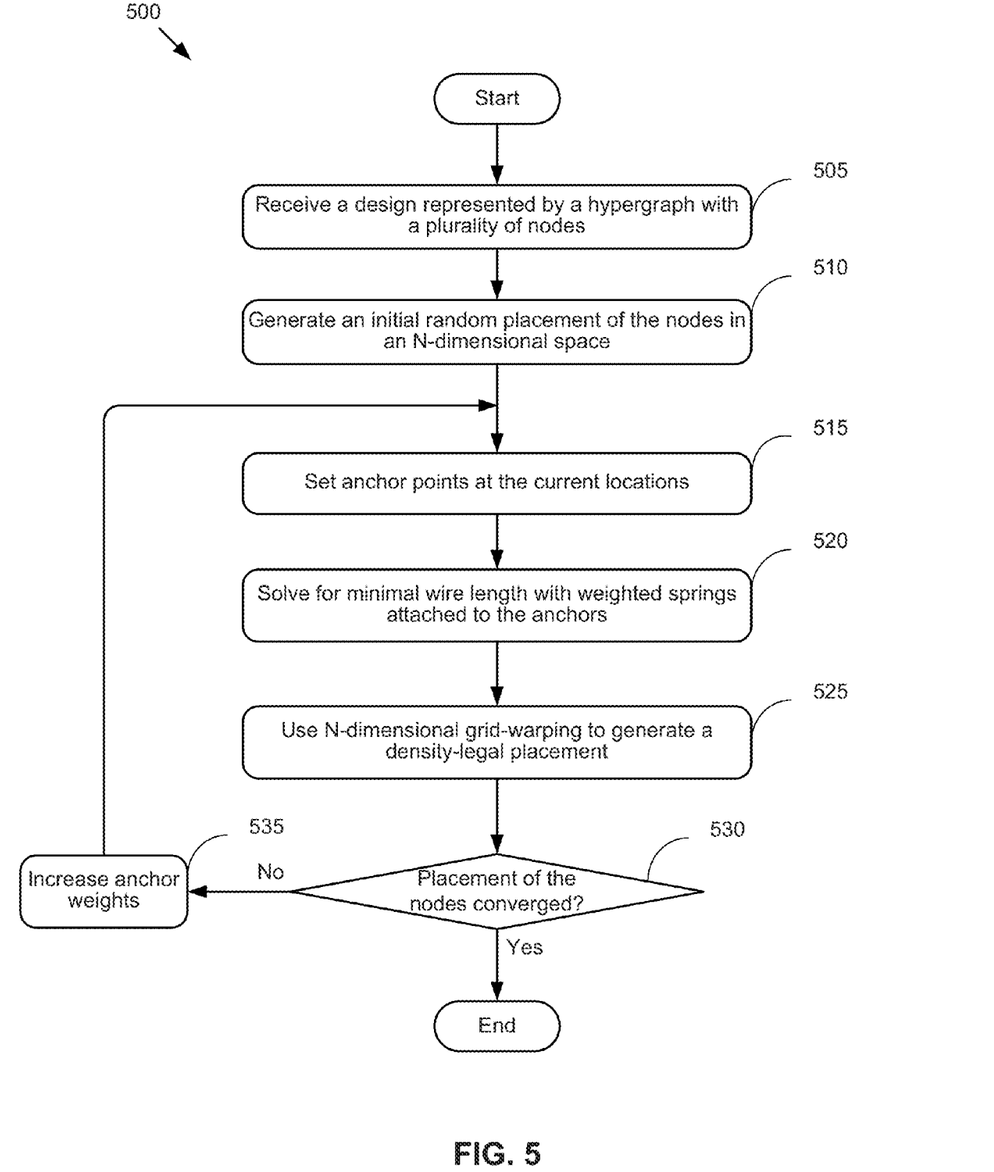
FIG. 5 is a flowchart of one embodiment of placing a hypergraph into an N-dimensional space.

FIG. 5 is a flowchart of one embodiment of placing a hypergraph into an N-dimensional space. Specifically, this figure describes a process 500 that performs hypergraph N-dimensional placement. In one embodiment, the process 500 starts when a design represented by a hypergraph is received, as described in block 310 of FIG. 3 and block 410 of FIG. 4. As shown in the figure, the process 500 begins by receiving, at block 505, a design represented by a hypergraph with a plurality of nodes.

At block 510, the process 500 generates an initial random placement of the nodes in an N-dimensional space. The process 500 at block 515 sets anchor points at the current locations for all the nodes in the hypergraph.

At block 520, the process 500 solves for minimal wire length with weighted springs attached to the anchors, where the force between the anchor and a node is proportional to the distance between them. In one embodiment, block 520 of the process 500 uses a conjugate gradient solver to solve for minimal wire quadratic wire length. In another embodiment, block 520 of the process 500 solves to minimize a monotonic function of wire length, which may include using a non-linear solver to solve for minimal wire length.

At block 525, the process 500 uses N-dimensional grid-warping to generate a density-legal placement. In one embodiment, the process 500 elastically deforms a model of the N-dimensional space on which the nodes have been roughly placed, repeatedly "stretching" it until the nodes arrange themselves in a density-legal way.

Next, at block 530 the process determines whether the placement of the nodes has converged. In one embodiment, the placement of nodes has converged when the newly solved and legalized placement does not change from the placement generated in the last iteration or the difference between the new placement and old placement is less than a pre-determined threshold.

If the placement has not converged, the process 500 increases, at block 535, the anchor weights. The process then returns back to block 515 to start a new iteration of solving for minimal wire length and legalizing the resulting placement. If the placement has converged, the process 500 ends.

One of ordinary skill in the art will recognize that the process 500 is a conceptual representation of the operations used to perform N-dimensional placement. The specific operations of the process 500 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 500 is performed by one or more software applications that execute on one or more computers.

Figure 6:
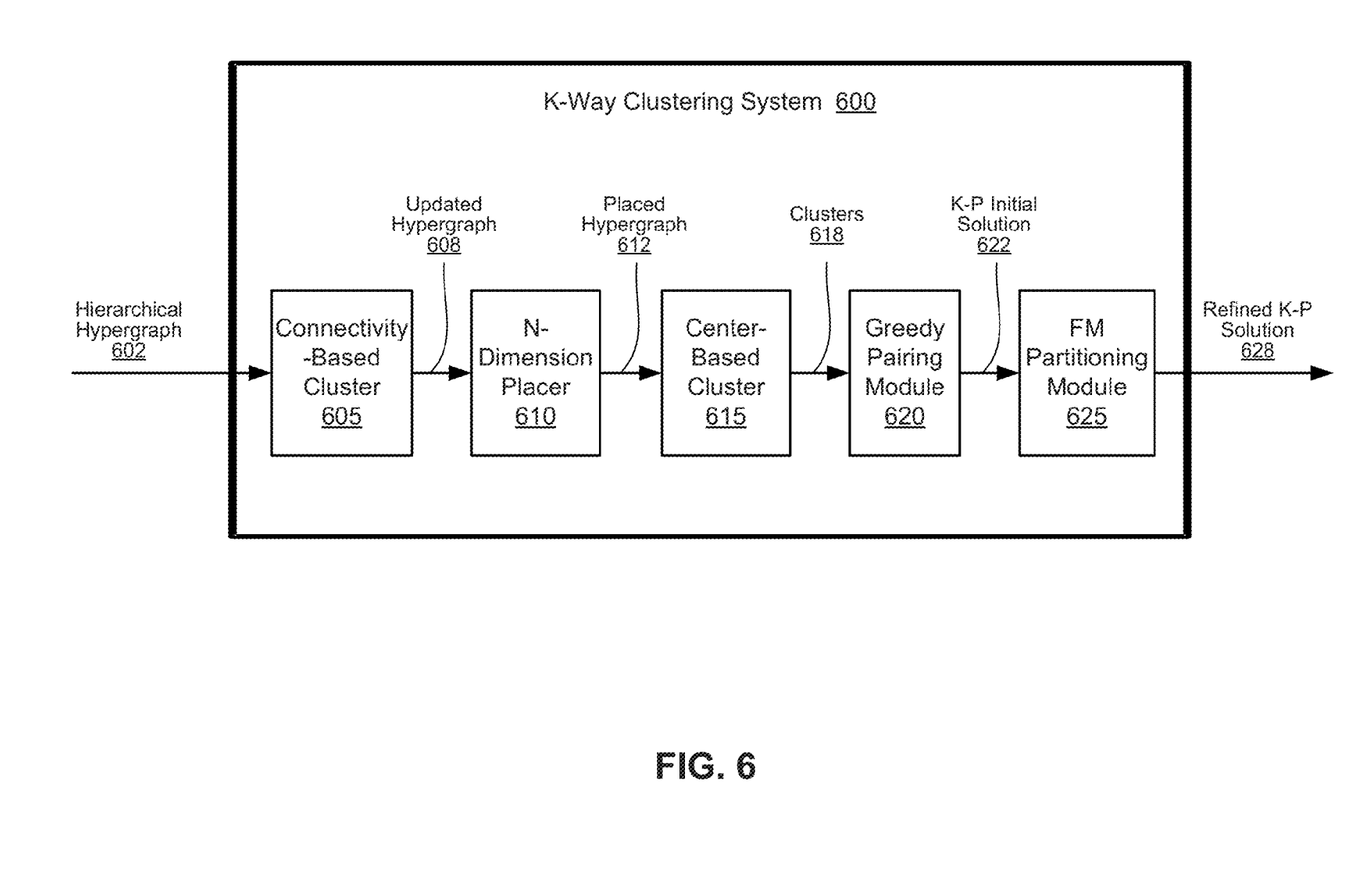
FIG. 6 conceptually illustrates one embodiment of a k-way clustering system.

FIG. 6 conceptually illustrates one embodiment of a k-way clustering system 600. Specifically, the figure illustrates one embodiment of a set of components for performing k-way clustering through N-dimensional placement, as described above in FIG. 3. In one embodiment, the k-way clustering system 600 is a stand-alone system, while in another embodiment the k-way clustering system 600 is part of a system for performing integrated circuit design. As shown in the figure, the k-way clustering system 600 includes a connectivity-based cluster module 605, an N-dimension placer 610, a center-based cluster module 615, a greedy pairing module 620, and a FM partitioning module 625.

The connectivity-based cluster module 605 receives a hierarchical hypergraph 602 that includes a plurality of nodes. In one embodiment, the hierarchical hypergraph is a netlist that represents an integrated circuit design that needs to be partitioned into k units of a system. In one embodiment, each unit of the system is a field programmable gate array (FPGA) and the integrated circuit design is partitioned for FPGA-based prototyping. Each logic circuit of the integrated circuit design is represented as a node in the hypergraph.

The connectivity-based cluster module 605 clusters the nodes of the hierarchical hypergraph in order to reduce the complexity of the placement problem. In one embodiment, the clustering, as described in block 310 of FIG. 3 above, is performed. As a result, nodes in the originally received hierarchical hypergraph 602 are partitioned into a plurality of clusters. Each cluster contains one or more nodes of the original hierarchical hypergraph 602. Each cluster is a single node in an updated hypergraph 608. Therefore, the updated hypergraph 608 has fewer nodes than the original hierarchical hypergraph 602. Some hyperedges in the original hypergraph may be fully contained in the clusters and are therefore not part of the updated hypergraph. Large hyperedges in the original hierarchical hypergraph 602 are also contracted to smaller hyperedges in the updated hypergraph 608.

The N-dimension placer 610 receives, from the connectivity-based cluster module 605, the updated hypergraph 608 and places the updated hypergraph 608 into an N-dimensional space. In one embodiment, the method as described in block 315 of FIG. 3 above is used.

The center-based cluster module 615 receives the placed hypergraph 612 from the N-dimension placer 610 and generates 2k clusters 618 using a center-based clustering algorithm. In one embodiment, the method as described in block 320 of FIG. 3 above is used. In one embodiment, the center-based clustering algorithm used is the k-harmonic-means algorithm with weighting to encourage balanced sizes of clusters in one embodiment. In another embodiment, the center-based clustering algorithm used can be k-means algorithm, fuzzy k-means algorithm, or Gaussian expectation-maximization. In one embodiment, the number of clusters 618 generated by the center-based cluster module 615 can be any number that is significant larger than k, e.g., one and a half times of k and 3k.

The greedy pairing module 620 receives the clusters 618 from the center-based cluster module 615 and greedily pairs the most highly connected clusters to generate a k-partition initial clustering solution 622. In one embodiment, the method as described in block 325 of FIG. 3 above is used. The greedy pairing module 620 selects groups of clusters to merge together to form single clusters in the next level of merging.

The FM partitioning module 625 receives the k-partition initial solution 622 generated by the greedy pairing module 620 and runs a single pass of FM algorithm to improve and legalize the initial solution 622. In one embodiment, the method as described in block 330 of FIG. 3 above is used. The FM partitioning module 625 produces a refined k-partition solution 628 as the output of the k-way clustering system 600.

The k-way clustering system 600 was described above for one embodiment of the invention. One of ordinary skill in the art will realize that in other embodiments this module can be implemented differently. For instance, in one embodiment described above, certain modules are implemented as software modules. However, in another embodiment, some or all of the modules of the k-way clustering system 600 might be implemented by hardware, which can be dedicated application specific hardware (e.g., an ASIC chip or component) or a general purpose chip (e.g., a microprocessor or FPGA).

Figure 7:
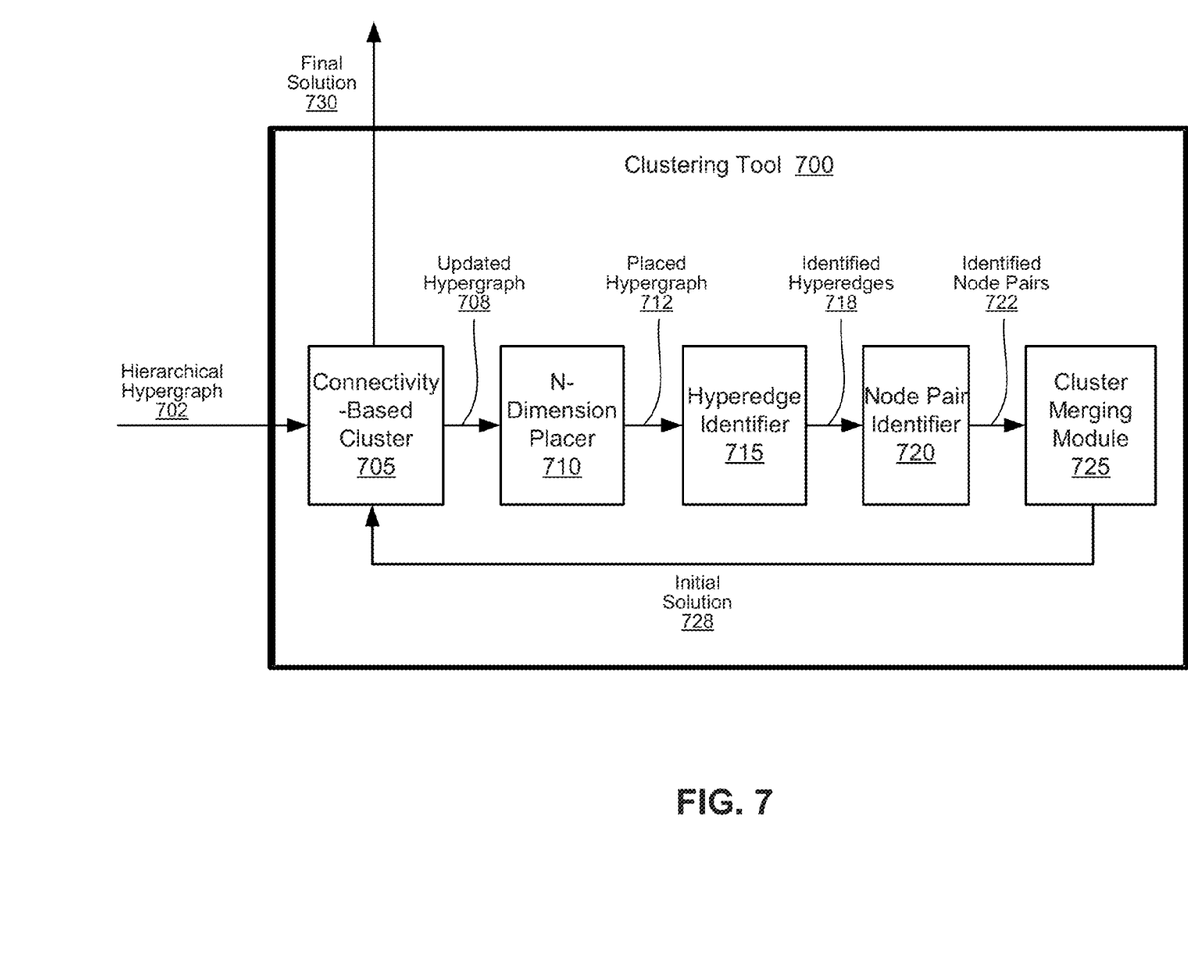
FIG. 7 conceptually illustrates one embodiment of a clustering tool that partitions a hypergraph without specifying the desired number of clusters.

FIG. 7 conceptually illustrates one embodiment of a clustering tool 700 that partitions a hypergraph without specifying the desired number of clusters. Specifically, the figure illustrates a set of components for performing clustering through N-dimensional placement without specifying k, as described above in FIG. 4. In one embodiment, the clustering tool 700 is a stand-alone system, while in another embodiment the clustering tool 700 is part of a system for performing integrated circuit design. As shown in the figure, the clustering tool 700 includes a connectivity-based cluster module 705, an N-dimension placer 710, a hyperedge identifier 715, a node pair identifier 720, and a cluster merging module 725.

The connectivity-based cluster module 705 receives a hierarchical hypergraph 702 that includes a plurality of nodes. In one embodiment, the hierarchical hypergraph is a netlist that represents an integrated circuit design that needs to be partitioned into k units of a system. In one embodiment, each unit of the system is a field programmable gate array (FPGA) and the integrated circuit design is partitioned for FPGA-based prototyping. Each logic circuit of the integrated circuit design is represented as a node in the hypergraph.

The connectivity-based cluster module 705 partially clusters the nodes of the hierarchical hypergraph 702 in order to reduce the complexity of the placement problem. In one embodiment, the connectivity-based clustering as described in block 410 of FIG. 4 above is performed. As a result, nodes in the originally received hierarchical hypergraph 702 are partitioned into several clusters. Each cluster contains one or more nodes of the original hierarchical hypergraph 702. Each cluster is a single node in an updated hypergraph 708. Therefore, the updated hypergraph 708 has fewer nodes than the original hierarchical hypergraph 702. Some hyperedges in the original hypergraph may be fully contained in the clusters and are therefore not part of the updated hypergraph. Large hyperedges in the original hierarchical hypergraph 702 are also contracted to smaller hyperedges in the updated hypergraph 708.

In one embodiment, the connectivity-based cluster module 705 performs the partial clustering by stopping the clustering when any new clustering will create a cluster whose resource usage is greater than a specified limit. In one embodiment, the limit is set so that the number of clusters created by the partial clustering is about 1000-5000. In one embodiment, In doing full clustering, a higher limit is set to create less than 100 clusters.

The N-dimension placer 710 receives, from the connectivity-based cluster module 705, the updated hypergraph 708 and places the updated hypergraph 708 into an N-dimensional space. In one embodiment, the method as described in block 415 of FIG. 4 above is used.

The hyperedge identifier 715 receives the placed hypergraph 712 from the N-dimension placer 710 and identifier all hyperedges with order less than an order threshold. In one embodiment, the method as described in block 420 of FIG. 4 above is used. In one embodiment, the order threshold is set to be eight. That means the hyperedge identifier 715 will identify all hyperedges that contains less than eight nodes.

The node pair identifier 720 receives the identified hyperedges 718 from the hyperedge identifier 715. For each identified hyperedge, the node pair identifier 720 evaluates all pairs of nodes connected to the hyperedge and identifies pairs of nodes connected by the hyperedge that the distance between two members of the pair is less than a distance threshold. In one embodiment, the method as described in block 425 of FIG. 4 above is used. In one embodiment, the distance threshold is set to be 5 cell-widths.

The cluster merging module 725 receives the identified node pairs 722 from the node pair identifier 720 and puts the received node pairs into a sorted list that is sorted based on the distance between two members of each pair in a non-decreasing order. In one embodiment, the method as described in block 430 of FIG. 4 above is used. The cluster merging module 725 selects node pairs, one by one, from the sorted list according to the sorted order, i.e., the closest pairs first. For each selected node pair, the cluster merging module 725 merges the clusters containing the two nodes of the node pair to form a new cluster. In one embodiment, the method as described in block 440 of FIG. 4 above is used. The cluster merging module 725 produces an initial clustering solution 728.

The connectivity-based cluster module 705 receives the initial clustering solution 728 from the cluster merging module 725. The connectivity-based cluster module 705 performs full clustering using connectivity-based clustering on the merged clusters of the initial clustering solution 728. The connectivity-based cluster module 705 produces a final clustering solution 730 as the output of the clustering tool 700.

The clustering tool 700 was described above for one embodiment of the invention. One of ordinary skill in the art will realize that in other embodiments this module can be implemented differently. For instance, in one embodiment described above, certain modules are implemented as software modules. However, in another embodiment, some or all of the modules of the clustering tool 700 might be implemented by hardware, which can be dedicated application specific hardware (e.g., an ASIC chip or component) or a general purpose chip (e.g., a microprocessor or FPGA).

This description and drawings are illustrative of embodiments of the invention and are not to be construed as limiting the invention. Numerous specific details are described to provide a thorough understanding of the disclosed embodiments. However, in certain instances, well known or conventional details are not described in order to avoid obscuring the description of the disclosed embodiments. References to "an" or "one" embodiment in the present disclosure are not necessarily to the same embodiment; such references mean at least one embodiment.

Many of the methods of the disclosed embodiments may be performed with a digital processing system, such as a conventional, general-purpose computer system. Special purpose computers, which are designed or programmed to perform only one function, may also be used.

Figure 8:
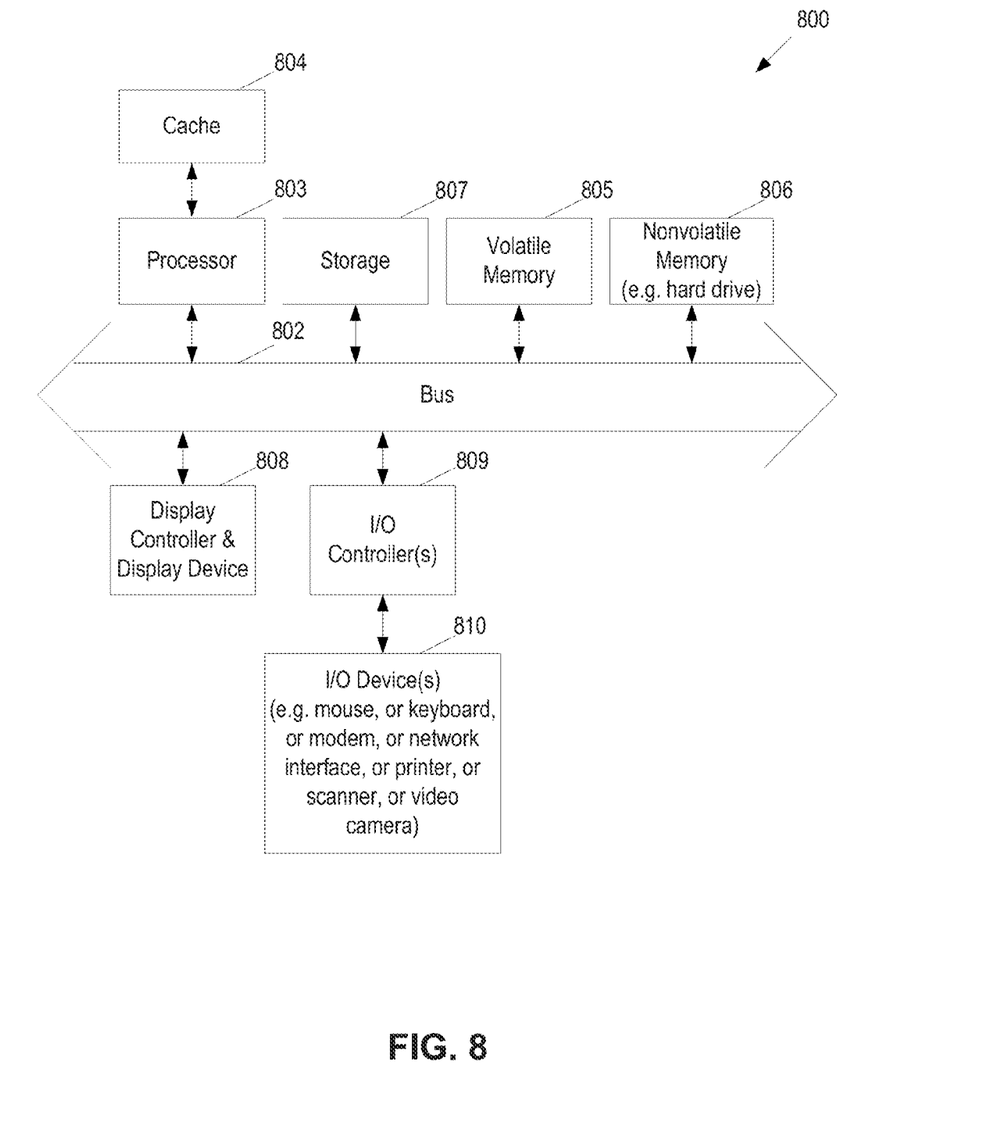
FIG. 8 shows one example of a typical computer system or data processing system that may be used with the disclosed embodiments.

FIG. 8 shows one example of a typical computer system or data processing system that may be used with the disclosed embodiments. For example, in one embodiment the processes described with respect to FIGS. 3-5 are operational through the example computing system. However, it is noted that while FIG. 8 illustrates various components of a computer system, it is not intended to represent any particular architecture or manner of interconnecting the components but rather provides an example representation of how the components and architecture may be configured. It will also be appreciated that network computers and other data processing systems that have fewer components or perhaps more components may also be used with the disclosed embodiments. The computer system of FIG. 8 may be any computing system capable of performing the described operations.

As shown in FIG. 8, the computer system 800, which is a form of a data processing system, includes a bus 802, which is coupled to one or more microprocessors 803. In one embodiment, computer system 800 includes one or more of a storage device (e.g., ROM) 807, volatile memory (e.g., RAM) 805, and a non-volatile memory (EEPROM, Flash) 806. The microprocessor 803 is coupled to cache memory 804 as shown in the example of FIG. 8. Cache memory 804 may be volatile or non-volatile memory.

The bus 802 interconnects these various components together and in one embodiment interconnects these components 803, 807, 805, and 806 to a display controller and display device 808. The computer system 800 may further include peripheral devices such as input/output (I/O) devices, which may be mice, keyboards, modems, network interfaces, printers, scanners, video cameras and other devices which are well known in the art. Typically, the input/output devices 810 are coupled to the system through input/output controllers 809.

The volatile memory 805 is typically implemented as dynamic RAM (DRAM) which requires power continually in order to refresh or maintain data in the memory. The non-volatile memory 806 is typically a magnetic hard drive, magnetic optical drive, an optical drive, a DVD RAM, a Flash memory, or other type of memory system that maintains data even after power is removed from the system. Typically, the non-volatile memory will also be a random access memory although this is not required.

While FIG. 8 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 802 may include one or more buses connected to each other through various bridges, controllers and/or adapters as is well known in the art. In one embodiment the I/O controller 809 includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques for example, the process of FIGS. 3-5 may be carried out in a computer system or other data processing system in response to its processor, such as a microprocessor, executing sequences of instructions contained in a memory, such as storage device 807, volatile memory 805, non-volatile memory 806, cache 804 or a remote storage device. In various embodiments, hardwired circuitry may be used in combination with software instructions to implement the disclosed embodiments. Thus, the techniques are not limited to any specific combination of hardware circuitry and software or to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as microprocessor 803.

A machine readable storage medium can be used to store software and data which when executed by a data processing system causes the system to perform various methods of the disclosed embodiments. This executable software and data may be stored in various places including for example storage device 807, volatile memory 805, non-volatile memory 806 and/or cache 804 as shown in FIG. 8. Portions of this software and/or data may be stored in any one of these storage devices.

Thus, a machine readable storage medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

The detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The detailed description is, therefore, not to be taken in a limiting sense, and the scope of the present invention is defined by the appended claims.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed description were presented as procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "sending" or "receiving" or "displaying" or "calculating" or "determining" or "multiplying" or "computing" or "identifying" or the like, refer to the action and processes of a computer system, or similar electronic computing device that manipulates and transforms data represented as physical (electronic) quantities within the computer system's registers and memories and other computer readable media into other data similarly represented as physical quantities within the computer system's memories or registers or other such information storage, transmission or display devices.

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

I claim:

1. A method of partitioning a design into smaller components upon receiving the design represented by a hypergraph with a plurality of nodes, the method comprising:
   by using a computing device, placing the plurality of nodes of the hypergraph into an N-dimensional space, wherein N is an integer that is greater than 2;
   identifying a set of hyperedges of the hypergraph based on a first set of criteria;
   for each identified hyperedge, identifying pairs of nodes connected by the hyperedge based on a second set of criteria;
   adding the identified pairs of nodes into a sorted list, wherein the sorted list is sorted based on a function of locations for each identified pair of nodes; and
   clustering identified pairs of nodes of the hypergraph;
   wherein the clustering is used in the generation of an integrated circuit; and
   wherein the clustering of the identified pairs of nodes of the hypergraph comprises iteratively: selecting a pair of nodes from the sorted list according to a sorted order, and merging the two nodes of the selected pair.

2. The method of claim 1 further comprising partially clustering nodes of the hypergraph before the placing the plurality of nodes of the hypergraph into an N-dimensional space.

3. The method of claim 2, wherein the partially clustering comprises using a hierarchy to partially cluster nodes of the hypergraph.

4. The method of claim 2, wherein the partially clustering comprises using a connectivity-based clustering method.

5. The method of claim 2, wherein the placing of the nodes of the hypergraph comprises placing of the partially clustered nodes into the N-dimensional space.

6. The method of claim 2, wherein the merging the two nodes of the selected pair further comprises merging the partial clusters containing the each of the two nodes of the selected pair.

7. The method of claim 1, wherein the first set of criteria is whether a hyperedge contains fewer nodes than an order threshold.

8. The method of claim 1, wherein the second criteria is a distance in a non-decreasing order.

9. The method of claim 1, wherein the hypergraph is a netlist that represents a circuit design.

10. The method of claim 1, wherein elements of the circuit design are partitioned into a plurality of FPGAs.

11. A computer program product stored as program code on a non-transitory computer-readable medium, the program code executable by at least one processor to partition a design into smaller components upon receiving the design represented by a hypergraph with a plurality of nodes, the computer program product comprising a computer readable program code comprising instructions for:
   initially placing the plurality nodes of the hypergraph randomly into an N-dimensional space, wherein N is an integer that is greater than 2;
   setting anchor points at the current locations of the placement of the plurality of nodes;
   solving for minimal wire length with weighted springs attached to the anchors;
   using N-dimensional grid-warping to generate a density-legal placement; and
   checking to see if the placement of the nodes has converged
   when the placement of the nodes has not converged, increasing the anchor weights and iterating through the setting anchor points, solving for minimal wire length, and using N-dimensional grid-warping to generate a density-legal placement; and
   wherein the density-legal placement is used to generate an integrated circuit.

12. The computer program product of claim 11, wherein the computer program product further comprising:
   when the placement of the nodes has not converged, increasing the anchor weights and iterating through the setting anchor points, solving for minimal wire length, and using N-dimensional grid-warping to generate a density-legal placement.

13. A computer program product stored as program code on a non-transitory computer-readable medium, the program code executable by at least one processor to partition a design into smaller components upon receiving the design represented by a hypergraph with a plurality of nodes, the computer program product comprising a computer readable program code comprising instructions for:
   placing the plurality of nodes of the hypergraph into an N-dimensional space, wherein N is an integer that is greater than 2;
   identifying a set of hyperedges of the hypergraph based on a first set of criteria;
   for each identified hyperedge, identifying pairs of nodes connected by the hyperedge based on a second set of criteria;
   adding the identified pairs of nodes into a sorted list, wherein the sorted list is sorted based on a function of locations for each identified pair of nodes; and clustering identified pairs of nodes of the hypergraph;
wherein the clustering is used in the generation of an integrated circuit; and
wherein the clustering of the identified pairs of nodes of the hypergraph comprises iteratively: selecting a pair of nodes from the sorted list according to a sorted order, and merging the two nodes of the selected pair.

14. The computer program product of claim 13, wherein the computer readable program code further comprises instructions for partially clustering nodes of the hypergraph before the placing the plurality of nodes of the hypergraph into an N-dimensional space.

15. The computer program product of claim 14, wherein the partially clustering comprises using a hierarchy to partially cluster nodes of the hypergraph.

16. The computer program product of claim 14, wherein the partially clustering comprises using a connectivity-based clustering method.

17. The computer program product of claim 14, wherein the merging the two nodes of the selected pair further comprises
merging the partial clusters containing the each of the two nodes of the selected pair.

18. The computer program product of claim 13, wherein the first set of criteria is whether a hyperedge contains fewer nodes than an order threshold.

19. The computer program product of claim 13, wherein the hypergraph is a netlist that represents a circuit design.

20. The computer program product of claim claim 19, wherein elements of the circuit design are partitioned into a plurality of FPGAs.

* * * * *